(12) United States Patent  (10) Patent No.: US 7,193,920 B2
Byeon et al.  (45) Date of Patent: Mar. 20, 2007

(54) SEMICONDUCTOR MEMORY DEVICE

(75) Inventors: Sang Jin Byeon, Gyeonggi-do (KR);
Kee Teok Park, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 104 days.

(21) Appl. No.: 11/169,949

(22) Filed: Jun. 30, 2005

(65) Prior Publication Data
US 2006/0104144 A1 May 18, 2006

(30) Foreign Application Priority Data
Nov. 15, 2004 (KR) ............... 10-2004-0093224
May 30, 2005 (KR) ............... 10-2005-0045483

(51) Int. Cl.
G11C 5/14 (2006.01)
(52) U.S. Cl. ............. 365/226; 365/189.07; 365/189.09
(58) Field of Classification Search ........... 365/226, 365/189.07, 189.09, 227, 230.03, 189.08
See application file for complete search history.

(56) References Cited

U.S. PATENT DOCUMENTS 5,943,282 A * 8/1999 Iwata et al. ............ 365/226
6,343,048 B1   1/2002 Jung
6,563,746 B2 * 5/2003 Fujioka et al. ......... 365/189.09
6,633,504 B1  10/2003 Lee et al.
6,674,684 B1   1/2004 Shen

FOREIGN PATENT DOCUMENTS

| JP | 10-340578 | 12/1998 |
| JP | 11-339469 | 12/1999 |
| JP | 2000-243098 | 9/2000 |
| JP | 2001-067894 | 3/2001 |
| JP | 2001-195898 | 7/2001 |
| KR | 1020030094740 A | 12/2003 |

* cited by examiner

*Primary Examiner*—Anh Phung
*Assistant Examiner*—Hien N Nguyen
(74) *Attorney, Agent, or Firm*—Heller Ehrman LLP

(57) ABSTRACT

A semiconductor memory device generates a control signal for regulating a potential of an internal power voltage when an extended mode register is set to adjust an operating speed and a tWR (time to write recovery) of a chip. The semiconductor memory device comprises an extended mode register setting unit and an internal power voltage generating unit. When an internal circuit enters into a specific mode for high-speed operation, the extended mode register setting unit outputs a plurality of internal power control signals to regulate a potential of an internal power voltage of the internal circuit. The internal power voltage generating unit generates an internal power voltage by regulating the potential of the internal power voltage in response to the plurality of internal power control signals.

20 Claims, 7 Drawing Sheets

SEMICONDUCTOR MEMORY DEVICE

BACKGROUND OF THE INVENTION

1. Field of the Invention

The present invention generally relates to a semiconductor memory device, and more specifically, to a technology of generating a control signal for regulating a potential of an internal power voltage when an extended mode register is set, thereby easily adjusting an operating speed and a tWR (time to write recovery) of a chip.

2. Description of the Related Art

Generally, a semiconductor memory device enters into a specific mode other than a normal mode through a mode register set (hereinafter, referred to as "MRS").

FIG. 1 is a diagram illustrating a conventional semiconductor memory device.

The conventional semiconductor memory device comprises a normal address generating unit 10 for generating normal addresses A1~An, a bank address generating unit 20 for generating bank addresses B1~Bn, a command generating unit 30 for generating commands such as a MRS command control signals MRS_control, a EMRS command control signals EMRS_control, a MRS 40 for setting a plurality of modes and an extended mode register set (hereinafter, referred to as "EMRS") 50.

The MRS 40 defines operation modes of a DRAM and a SDRAM on a basis of information such as a burst length, a CAS latency and an operating mode. The MRS 40 is programmed by the MRS command control signals MRS_control, and programs stored information again or maintains the information until a power source of the device is turned off.

The EMRS 50 is operated in the similar way to that of the MRS 40, and sets a specific mode other than modes set in the MRS 40.

In the above-described conventional semiconductor memory device which is completed as a package, a predetermined potential of an internal power voltage is maintained even an external power voltage is increased.

To speed up the semiconductor memory device completed as a package, if necessary, the internal power voltage is required to rise. However, after the semiconductor memory device is completed as a package, the potential of the internal power voltage cannot be changed even when the external power voltage is increased.

SUMMARY OF THE INVENTION

Accordingly, it is an object of the present invention to provide a semiconductor memory device for generating an internal power control signal to regulate a potential of an internal power voltage in an extended mode register set unit, thereby adjusting the operating speed of the semiconductor memory device after packaged.

In an embodiment, a semiconductor memory device comprises an extended mode register setting unit, a reference voltage control unit and an internal power voltage driving unit. When an internal circuit enters into a specific mode for high-speed operation, the extended mode register setting unit outputs a plurality of internal power control signals to regulate a potential of an internal power voltage of the internal circuit. The reference voltage control unit controls a reference voltage level in response to the plurality of internal power control signals to generate a reference voltage control signal. The internal power voltage driving unit regulates an internal power voltage level in response to the reference voltage control signal.

In another embodiment, a semiconductor memory device comprises an extended mode register setting unit, a reference control unit and an internal power voltage driving unit. When an internal circuit enters into a specific mode for high-speed operation, the extended mode register setting unit outputs a plurality of internal power control signals to regulate a potential of an internal power voltage of the internal circuit. The reference voltage control unit controls a reference voltage level in response to the plurality of internal power control signals to generate a reference voltage control signal. The internal power voltage driving unit regulates an internal power voltage level in response to the reference voltage control signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 2:
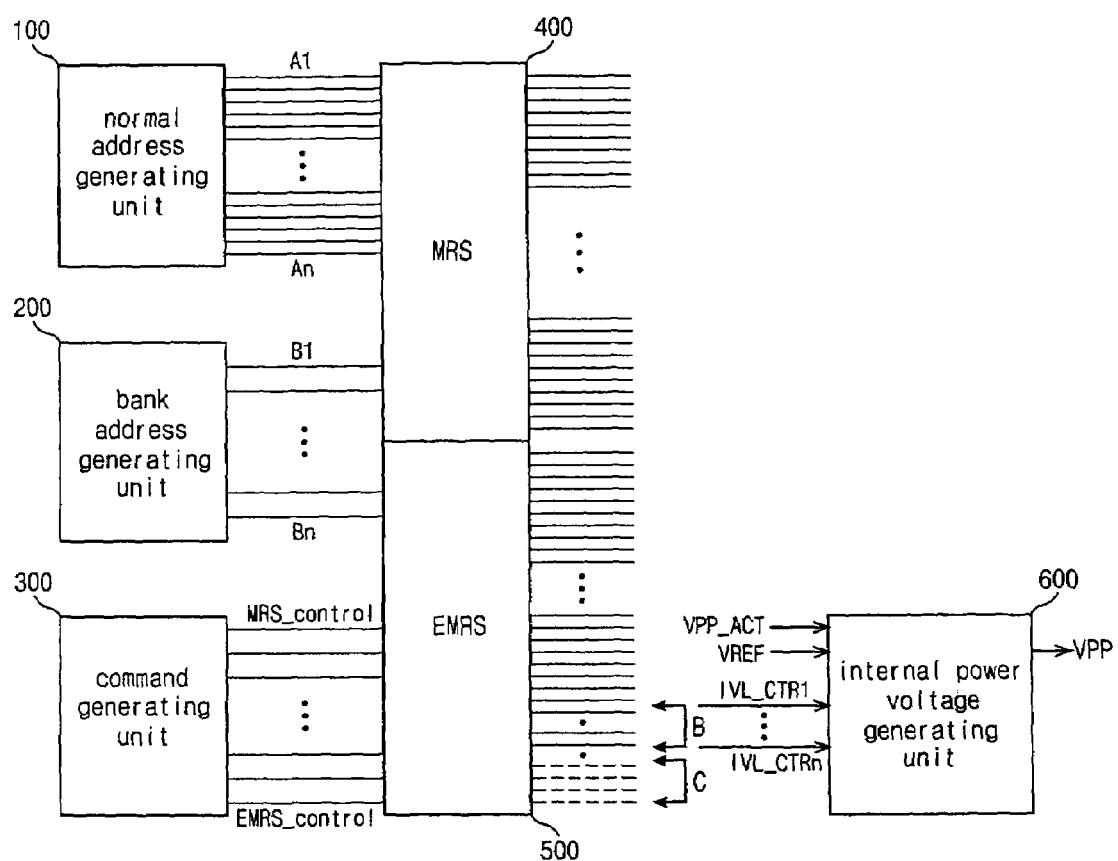
FIG. 2 is a diagram illustrating a semiconductor memory device according to an embodiment of the present invention.

FIG. 2 is a diagram illustrating a semiconductor memory device according to an embodiment of the present invention.

In an embodiment, a semiconductor memory device comprises a normal address generating unit 100 for generating normal addresses A1~An, a bank address generating unit 200 for generating bank addresses B1~Bn, a command generating unit 300 for generating commands such as a MRS command control signal MRS_control, a EMRS command control signals EMRS_control, a MRS 400 for setting a plurality of modes and an extended mode register set (hereinafter, referred to as "EMRS") 500, and an internal power voltage generating unit 600.

The MRS 400 defines operating modes of a DRAM or SDRAM on a basis of information such as a burst length, a CAS latency, an operating mode. The MRS 400 is programmed by MRS command control signals MRS_control, and programs stored information again or maintains the information until a power source is turned off.

Referring to Tables 1 through 5, the operating modes of the MRS 400 in each address are explained below.

TABLE 1

Values of mode registers in each address

| Address | BA0 | BA1 | A12 | A11 | A10 | A9 | A8 | A7 | A6 | A5 | A4 | A3 | A2 | A1 | A0 |
|---|---|---|---|---|---|---|---|---|---|---|---|---|---|---|---|
| Mode register | 0 | 0 | Operating mode | | | | | | CAS latency | | | Burst type | Burst length | | |

TABLE 2

Burst length determined by combination of values of the addresses A0~A2

| A2 | A1 | A0 | Burst length |
|---|---|---|---|
| 0 | 0 | 0 | Reserved |
| 0 | 0 | 1 | 2 |
| 0 | 1 | 0 | 4 |
| 0 | 1 | 1 | 8 |
| 1 | 0 | 0 | Reserved |
| 1 | 0 | 1 | Reserved |
| 1 | 1 | 0 | Reserved |
| 1 | 1 | 1 | Reserved |

TABLE 3

Burst type determined by the address A3

| A3 | Burst type |
|---|---|
| 0 | Sequential |
| 1 | Interleaved |

TABLE 4

CAS latency determined by combination of values of the addresses A4~A6

| A6 | A5 | A4 | CAS latency |
|---|---|---|---|
| 0 | 0 | 0 | Reserved |
| 0 | 0 | 1 | Reserved |
| 0 | 1 | 0 | 2 |
| 0 | 1 | 1 | 3 |
| 1 | 0 | 0 | Reserved |
| 1 | 0 | 1 | 1.5 |
| 1 | 1 | 0 | 2.5 |
| 1 | 1 | 0 | Reserved |

TABLE 5

Operating modes determined by combination of values of the addresses A7~A12

| A12~A9 | A8 | A7 | A6~A0 | Operating mode |
|---|---|---|---|---|
| 0 | 0 | 0 | Valid | Normal mode |
| 0 | 1 | 0 | Valid | Normal mode |
| 0 | 0 | 1 | | Test mode |
| — | — | — | | Reserved |

Figure 1:
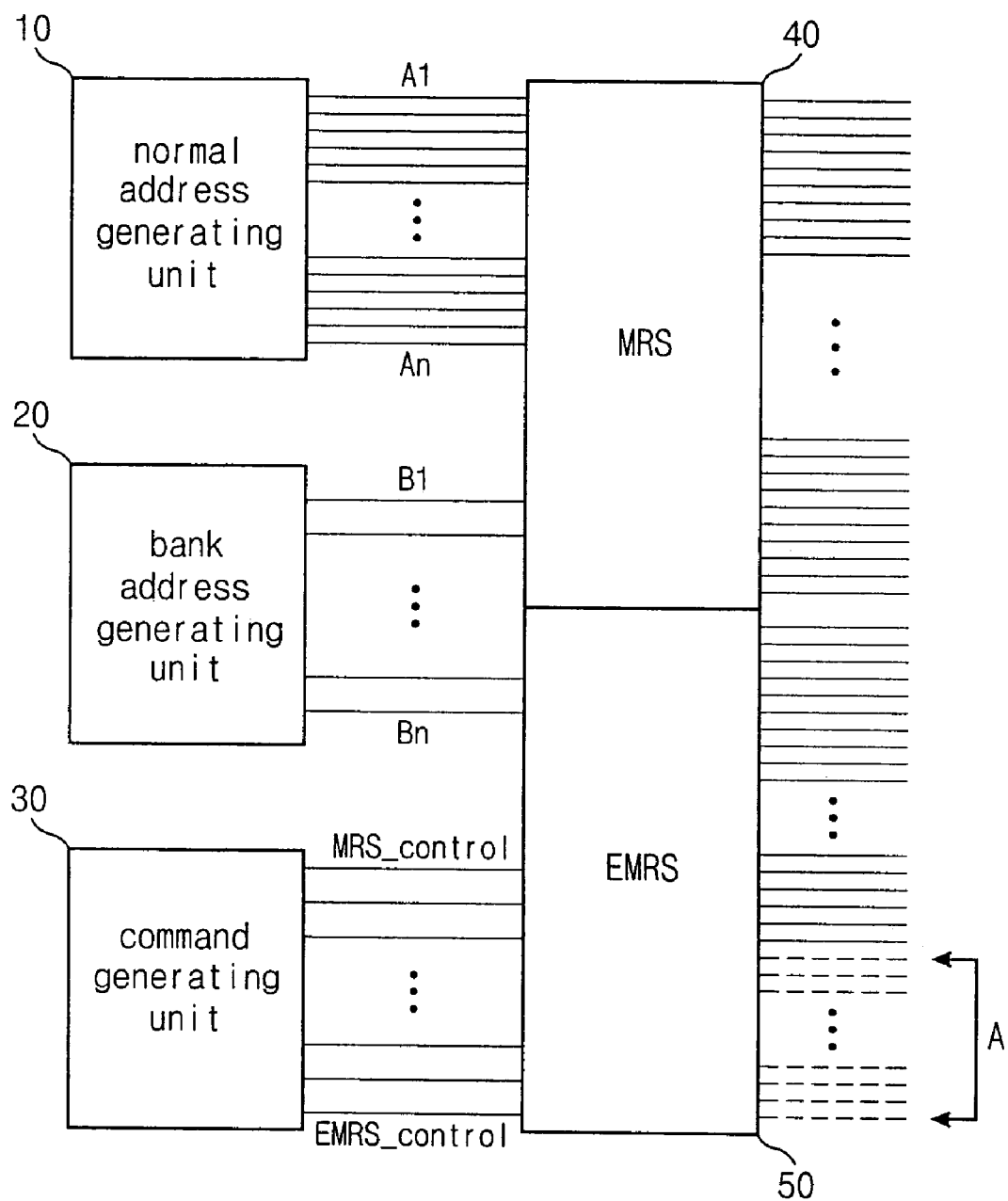
FIG. 1 is a diagram illustrating a conventional semiconductor memory device.

The EMRS 500 operated in the similar way to that of the MRS 400 sets a specific mode other than modes set in the MRS 400, and has a pin B for regulating a potential of an internal power voltage and an additional pin C. Here, the pin B for regulating a potential of an internal power voltage uses a part of additional pins A in conventional FIG. 1.

TABLE 6

Values of mode resisters in each address

| Address | BA0 | BA1 | A12 | A11 | A10 | A9 | A8 | A7 | A6 | A5 | A4 | A3 | A2 | A1 | A0 |
|---|---|---|---|---|---|---|---|---|---|---|---|---|---|---|---|
| Mode register | 0 | 1 | Operating mode | | | | | | | | | | 0 | DS | DLL |

TABLE 7

DLL determined by the address A0

| A0 | DLL |
|---|---|
| 0 | Enable |
| 1 | Disable |

TABLE 8

Driving strength determined by the address A1

| A1 | Driving strength |
|---|---|
| 0 | Normal |
| 1 | Weak |

TABLE 9

Operating modes determined by combination of values of the addresses A3~An

| A3 | A2-A0 | Operating mode |
|---|---|---|
| 0 | Valid | Normal operation |
| — | — | All other states reserved |

Here, the EMRS 500 uses a part of the conventional additional pins(A) as a pin(B) for outputting internal power control signals IVL_CTR1~IVL_CTRn to regulate a potential of an internal power voltage of an internal circuit. The internal power voltage generating unit 600 outputs an internal voltage Vin in response to the internal power control signals IVL_CTR1, IVL_CTRn and a reference voltage VREF. Here, although an example where the internal power voltage generating unit 600 generates the boosting voltage VPP is exemplified, the internal power control signals IVL_CTR1, IVL_CTRn can be applied to circuits for generating all internal power voltages such as a core voltage VCORE, a boosting voltage VPP, a peri voltage VPERI, a bitline precharge voltage VBLP, a cell plate voltage VCC and a bulk voltage VBB.

Here, the boosting voltage VPP is a power source for reading/writing data through a n-type cell transistor, the core voltage VCORE as a power source used in a core of the DRAM is a power source which is a base of other power sources at a data level of the cell. The bulk voltage VBB a power source having a negative potential used to reduce leakage current of the cell transistor for stability of a threshold voltage Vth, and the peri voltage VPERI is a power source used in a peripheral region of the DRAM. The bit line precharge voltage VBLP as a power source for precharging a bit line corresponds to a half level of the core voltage for stability and reduction of power consumption. The cell plate voltage VCP as a power source loaded in a cell plate is a power source which corresponds to a half level of the core voltage and is used for reliability of an ONO-structured cell.

Figure 3:
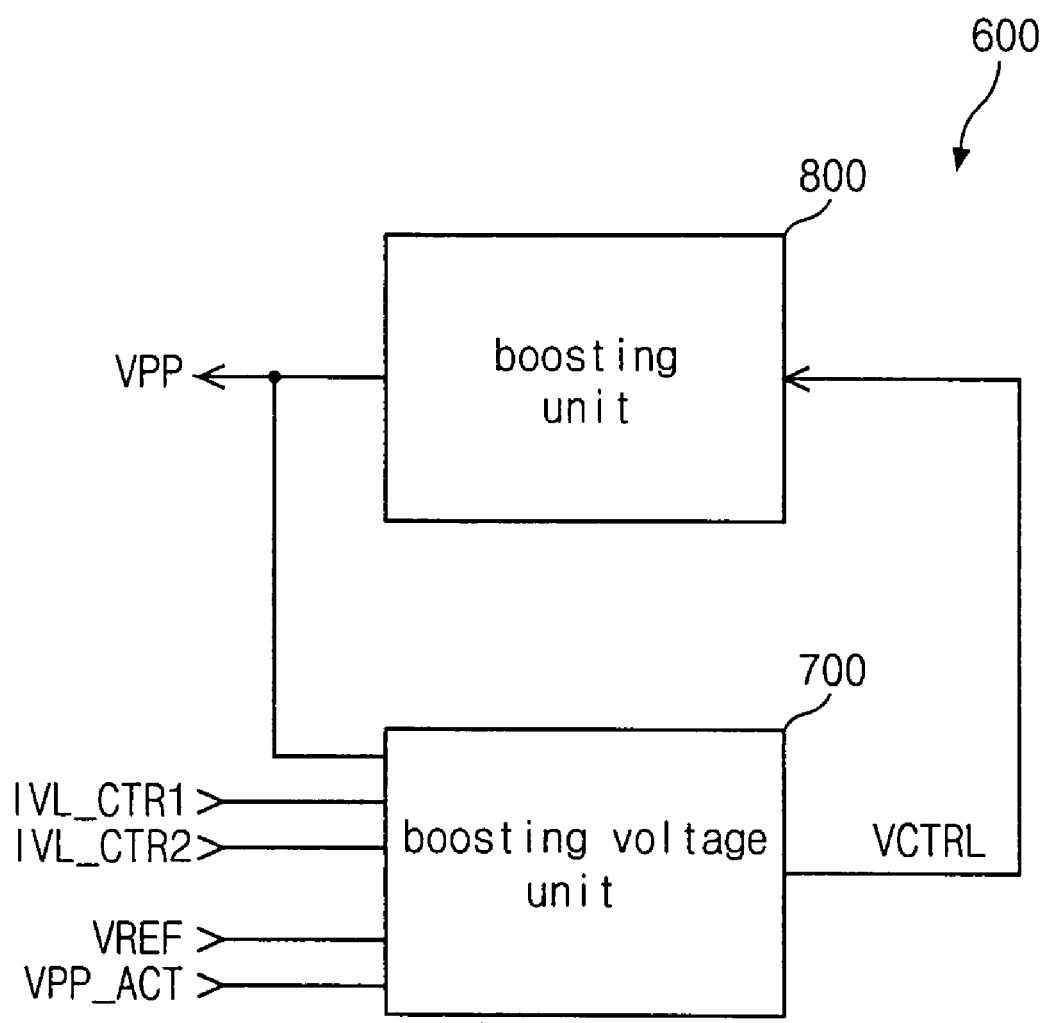
FIG. 3 is a detailed diagram illustrating an internal power voltage generating unit of FIG. 2 according to an embodiment of the present invention.

FIG. 3 is a detailed diagram illustrating an internal power voltage generating unit 600 of FIG. 2 according to an embodiment of the present invention. FIG. 3 shows when a boosting voltage VPP of internal power voltages is regulated and outputted.

The internal power voltage generating unit 600 comprises an boosting voltage control unit 700 and a boosting unit 800.

The boosting voltage control unit 700 senses a level of the boosting voltage VPP, and outputs a voltage control signal VCTRL for controlling the level of the boosting voltage VPP in response to the internal power control signals IVL_CTR1~IVL_CTRn, the reference voltage VREF and the active signal VPP_ACT. The boosting unit 800 boosts an external power voltage in response to the voltage control signal VCTRL to output the boosting voltage VPP.

Figure 4:
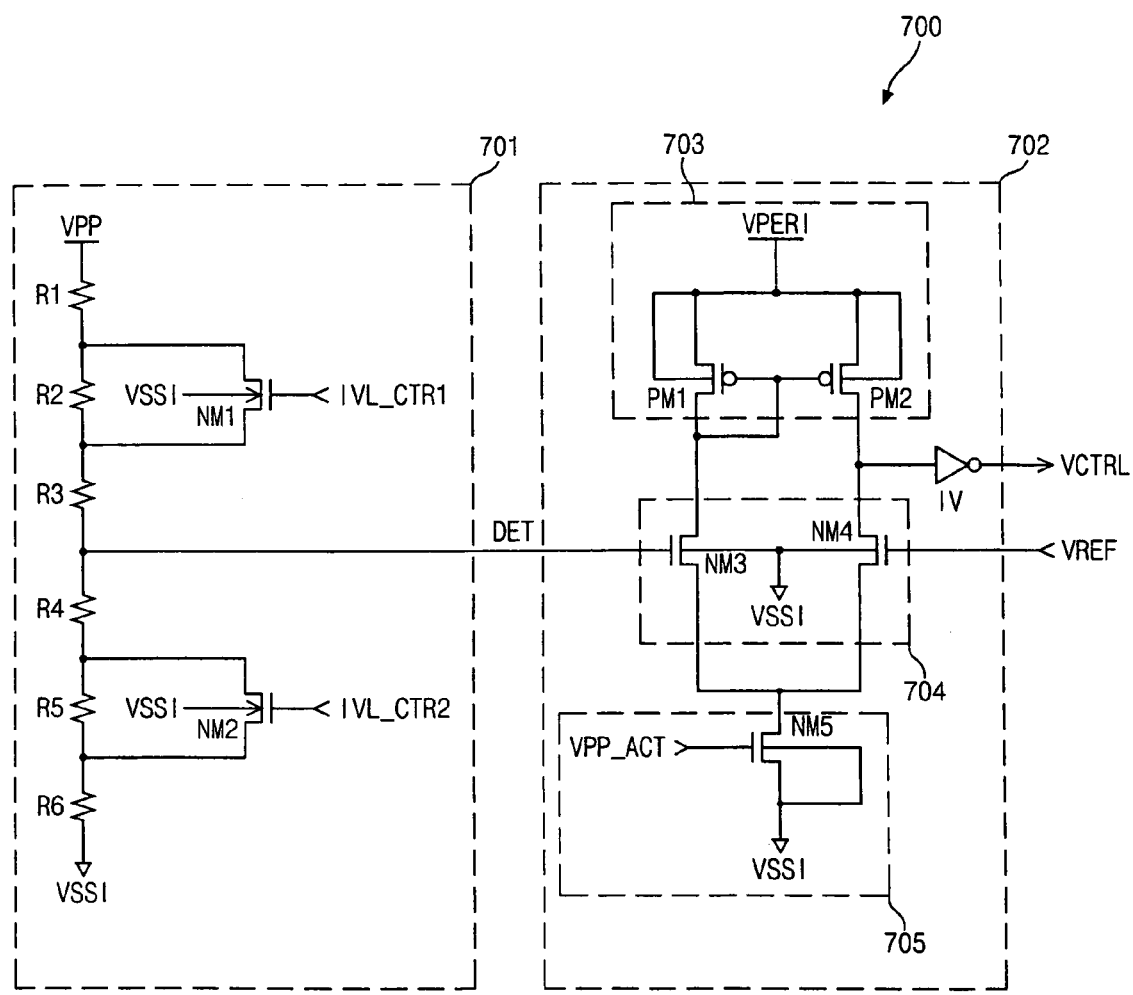
FIG. 4 is a detailed circuit diagram illustrating an internal power voltage control unit of FIG. 3.

FIG. 4 is a detailed circuit diagram illustrating the boosting voltage control unit 700 of FIG. 3.

The boosting voltage control unit 700 comprises a voltage dividing unit 701 and a sensing control unit 702.

The voltage dividing unit 701 comprises a plurality of resistors R1~R6, and NMOS transistors NM1 and NM2.

The resistors R1~R6 are connected serially between a boosting voltage VPP terminal and a ground voltage VSSI, and the NMOS transistors NM1 and NM2 are connected in parallel to both end terminals of the resistors R2 and R5. Here, the NMOS transistors NM1 and NM2 determines a potential of a common node of the resistors R3 and the resistors R4 in response to the internal power control signals IVL_CTR1 and IVL_CTR2 outputted from the EMRS 500.

The sensing control unit 702 comprises a current mirror 703, a comparison unit 704, an enable unit 705 and inverter IV1.

The current mirror 703 comprises PMOS transistors PM1 and PM2 which have a common source common connected to a peri voltage VPERI terminal, each drain connected to each drain of NMOS transistors NM3 and NM4 and gates connected to the drain of the PMOS transistor PM1.

The comparison unit 704 which comprises NMOS transistors NM3 and NM4 compares and amplifies a voltage dividing signal DET and the reference voltage signal VREF. That is, the NMOS transistors NM3 and NM4 are controlled by the voltage dividing signal DET and the reference voltage signal VREF, respectively. As a result, the NMOS transistor NM3 is turned on stronger than the NMOS transistor NM4 when the voltage dividing signal DET is higher than the reference voltage signal VREF, and the NMOS transistor NM4 is turned on stronger than the NMOS transistor NM3 when the dividing signal DET is lower than the reference voltage signal VREF.

The enable unit 705 which comprises a NMOS transistor NM5 controlled by the active signal VPP_ACT activates the sensing control unit 700. That is, the NMOS transistor NM5 has a drain to receive a ground voltage level in response to the active signal VPP_ACT.

An inverter IV1 inverts an output signal from a common node of the PMOS transistor PM2 and the NMOS transistor NM4, and outputs the voltage control signal VCTRL.

Hereinafter, the operation of the internal power voltage generating unit 600 is described.

The NMOS transistors NM1 and NM2 of the voltage dividing unit 701 are selectively turned on in response to the internal power control signals IVL_CTR1 and IVL_CTR2 to regulate a resistance ratio. The sensing control unit 702 compares the reference voltage signal VREF with the voltage dividing signal DET which is divided by the resistance ratio, and outputs the voltage control signal VCTRL. That is, the sensing unit 702 outputs the voltage control signal VCTRL having a high level when the voltage dividing signal DET is higher than the reference voltage signal VREF, and the voltage control signal VCTRL having a low level when the voltage dividing signal DET is lower than the reference voltage signal VREF.

The boosting unit 800 boosts an external power voltage in response to the voltage control signal VCTRL to output the boosting voltage VPP. That is, the boosting unit 800 boosts the external power voltage when the voltage control signal VCTRL is at the low level.

Thereafter, when the level of the boosting voltage VPP is further increased for increase in the speed of the semiconductor memory device, the voltage dividing unit 701 controls the NMOS transistors NM1 and NM2 in response to the internal power control signals IVL_CTR1 and IVL_CTR2 which are outputted from the EMRS 500 to regulate the resistance ratio, and then sets the voltage dividing signal DET to have a lower level than that of the reference voltage signal VREF to output the voltage control signal having the low level. Next, the boosting unit 800 further boosts the boosting voltage VPP.

Figure 5:
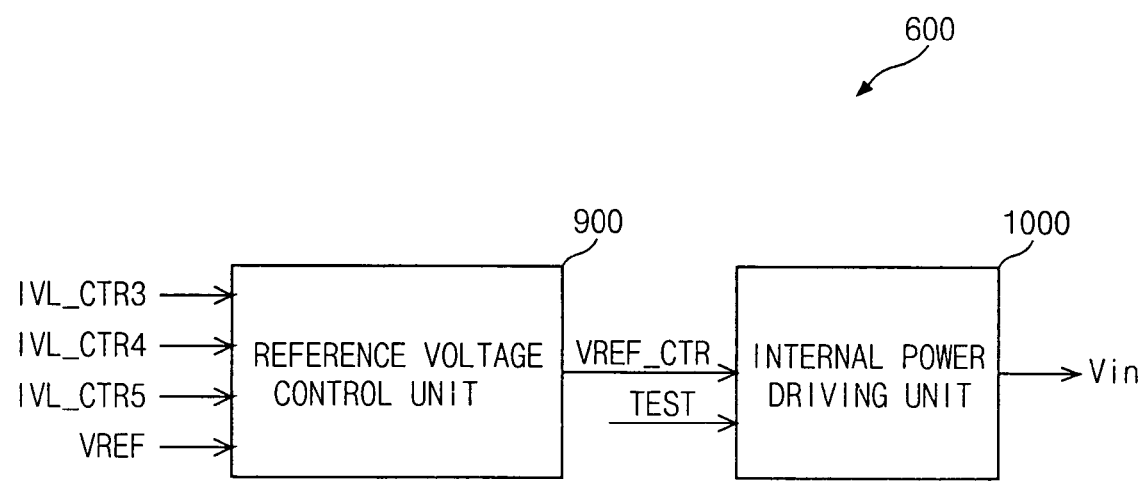
FIG. 5 is a detailed diagram illustrating an internal power voltage generating unit of FIG. 2 according to another embodiment of the present invention.

FIG. 5 is a detailed diagram illustrating the internal power voltage generating unit 600 of FIG. 2 according to another embodiment of the present invention.

In this embodiment, the internal power voltage generating unit 600 comprises a reference voltage control unit 900 and an internal power voltage driving unit 1000.

The reference voltage control unit 900 outputs a reference voltage control signal VREF_CTR in response to internal power control signals IVL_CTR3~IVL_CTR5 and a reference voltage VREF. The internal power voltage driving unit 1000 generates an internal power voltage Vin in response to the reference voltage control signal VREF-CTR and a test signal TEST.

Figure 6:
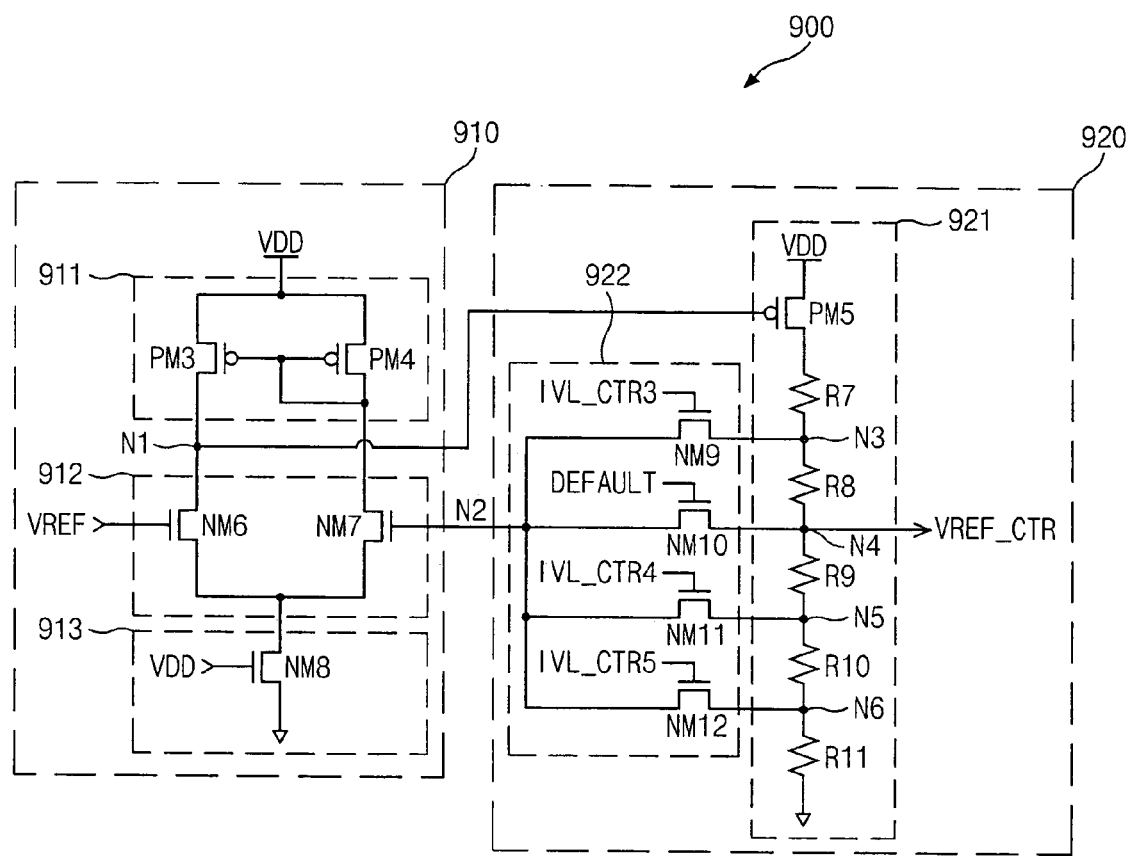
FIG. 6 is a circuit diagram illustrating a reference voltage control unit of FIG. 5.

FIG. 6 is a detailed circuit diagram illustrating the reference voltage control unit 900 of FIG. 5.

The reference voltage control unit 900 comprises a differential amplification unit 910 and a voltage control unit 920.

The differential amplification unit 910 comprises a current mirror 911, a comparison unit 912 and an enable unit 913. The current mirror 911 comprises PMOS transistors PM3 and PM4 whose sources are connected to a power voltage terminal and gates are connected in common to a drain of the PMOS transistor P4.

The comparison unit 912 comprises NMOS transistors NM6 and NM7 whose gates receive the reference voltage VREF and a signal of a node N2, respectively to compare and amplify a level difference between the reference voltage VREF and the signal of the node N2.

The enable unit 913 comprises a NMOS transistor NM8 which is constantly turned on by a power voltage VDD and applies a ground voltage level to the comparison unit 912.

The voltage control unit 920 comprises a voltage dividing unit 921 and a switching unit 922.

The voltage dividing unit 921 comprises a PMOS transistor PM5 and resistors R7~R11 which are connected serially between a power voltage terminal and a ground voltage terminal. The PMOS transistor PM5 applies a power voltage level to its drain in response to a signal of a node N1. The resistors R7~R11, which are connected serially between the ground voltage terminal and a drain of the PMOS transistor PM5, divides a voltage of the drain of the PMOS transistor PM5.

The switching unit 922 comprises a plurality of NMOS transistors NM9~NM12 which are connected in parallel between the node N2 and the plurality of resistors R7~R11. The NMOS transistors NM9, NM11, NM12 selectively apply each voltage of nodes N3~N6 to the node N2 in response to the internal power control signals IVL_CTR3~IVL_CTR5. The NMOS transistor N10 applies a voltage of the node N4 to the node N2 in response to a default value. That is, when an internal voltage is not adjusted, the NMOS transistor NM10 is only turned on to apply the voltage of the node N4 to the node N2. On the other hand, when the internal voltage is regulated, the NMOS transistors NM9, NM11 and NM12 are controlled to selectively apply different voltages of the nodes N3, N5 and N6 to the node N2.

Hereinafter, the operation of the above-described reference voltage control unit 900 is described.

The comparison unit 912 compares the reference voltage VREF with the voltage of the node N2. When a level of the reference voltage VREF is higher than a voltage level of the node N2, the NMOS transistor NM6 is turned on to output a low level signal through the node N1. As a result, the PMOS transistor PM5 is turned on to apply a power voltage level to one terminal of the resistors R7~N11 and divide the power voltage level through the resistors R7~R11. Meanwhile, the level of the reference voltage VREF is lower than the voltage level of the node N2, the NMOS transistor N7 is turned on, so that the PMOS transistors PM3 and PM4 are turned on to output a high level signal through the node N1.

When the internal power control signal IVL_CTR3 outputted from the EMRS 500 is activated, the NMOS transistor NM9 is turned on to apply a voltage of the node N3 to the node N2. As a result, the voltage of the node N2, which is a level of the voltage control signal VREF_CTR, becomes lower than a level of the reference voltage VREF, the NMOS transistor NM6 is turned on. When the internal power control signal IVL_CTR4 is activated, the NMOS transistor NM11 is turned on to apply a voltage of the node N5 to the node N2, so that the level of the node N2 becomes higher than that of the reference voltage VREF to turn on the NMOS transistor NM7. In this way, the voltage level of the node N2 becomes even higher when the internal power control signal IVL_CTR5 is activated than when the internal power control signal IVL_cTR4 is activated.

Figure 7:
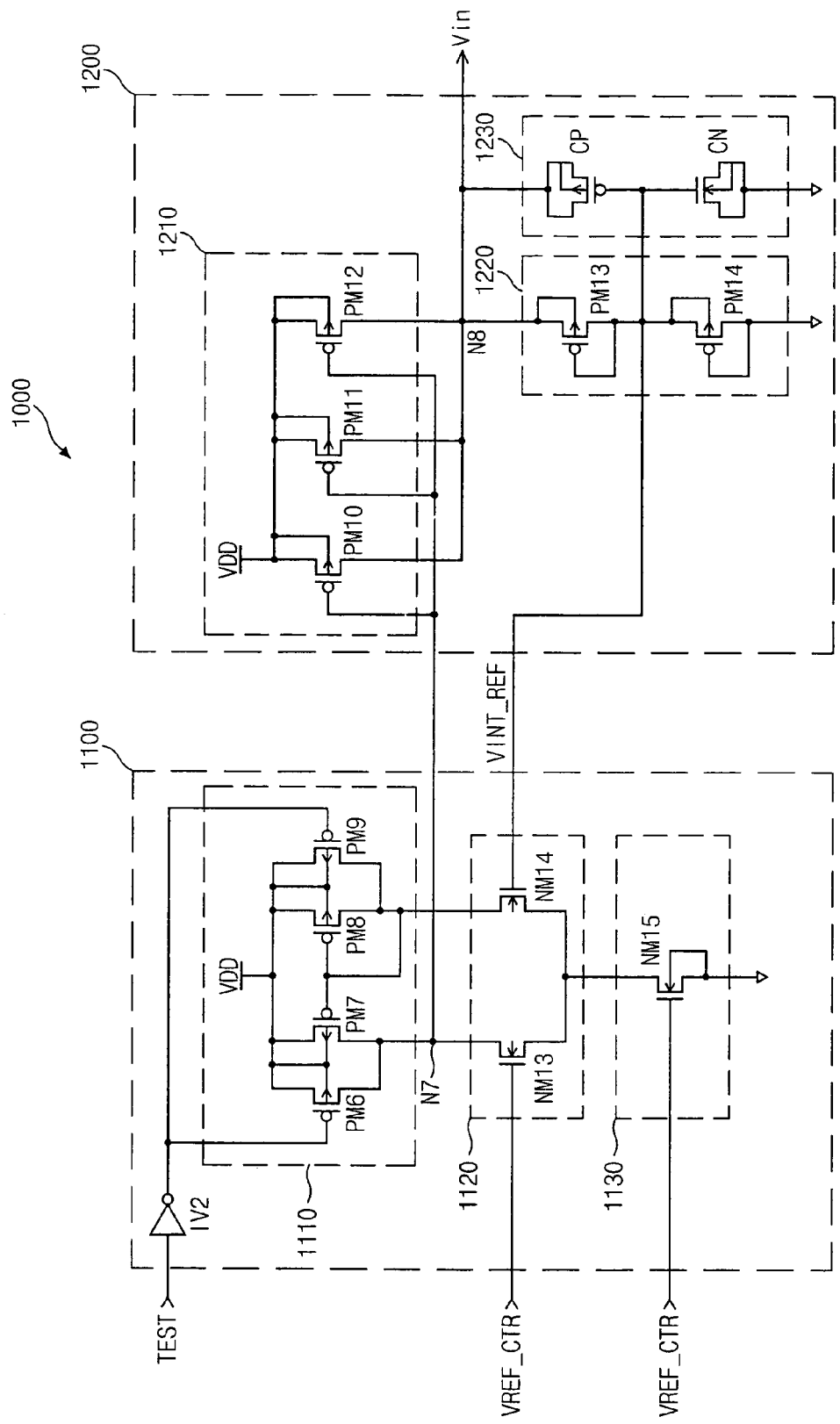
FIG. 7 is a circuit diagram illustrating an internal voltage generating unit FIG. 5.

FIG. 7 is a circuit diagram illustrating the internal power voltage driving unit 1000 of FIG. 5.

The internal power voltage driving unit 1000 outputs an internal power voltage Vin in response to the reference voltage control signal VREF_CTR controlled by the internal power control signals IVL_CTR3~IVL_CTR5 outputted from the EMRS 500.

To more fully describe the configuration, the internal power voltage driving unit 1000 comprises an inverter IV2, a differential amplification unit 1100 and an output unit 1200. The differential amplification unit 1100 comprises a current mirror 1110, a comparison unit 1120 and an enable unit 1130. The inverter IV2 inverts a test signal TEST that is disabled to a low level at a normal mode and enabled to a high level at a test mode.

The current mirror 1110 comprises PMOS transistors PM6~PM9. The PMOS transistors PM7 and PM8 have sources connected to a power voltage terminal and gates connected in common to a drain of the PMOS transistor PM8. The PMOS transistors PM6 and pM9 have sources connected to the power voltage terminal, gates connected to an output terminal of the inverter IV2, and drains connected to drains of the PMOS transistors PM7 and PM8, respectively to facilitate driving of the PMOS transistors PM7 and PM8.

The comparison unit 1120 comprises NMOS transistors NM13 and NM14 whose gates to receive the reference voltage control signal VREF_CTR and an internal voltage reference signal VINT_REF to compare and amplify a level difference of the reference voltage control signal VREF_CTR and the internal voltage reference signal VINT_REF.

The enable unit 1130 comprises NMOS transistor NM15 for applying a ground voltage level to the comparison unit 1120 in response to the reference voltage control signal VREF_CTR.

The output unit 1200 comprises a driving unit 1210, a voltage dividing unit 1220 and a noise preventing unit 1230. The driving unit 1210 comprises PMOS transistors PM10~PM12 which are connected in parallel between the power voltage terminal and an output node N8. Here, the PMOS transistors PM10~PM12 apply a power voltage level to the output node N8 in response to a voltage signal of the node N7.

The voltage dividing unit 1220 comprises PMOS transistors PM13 and PM14 which are connected serially between the output node N8 and the ground voltage terminal. The PMOS transistors PM13 and PM14 whose gates are connected to drains that serve as a diode divide the internal power voltage Vin of the output node N8. Preferably, the internal power voltage Vin is set to be twice larger than the internal voltage reference signal VINT_REF.

The noise preventing unit 1230 comprises capacitors CP and CN which are connected serially between the output node N8 and the ground voltage terminal. The noise preventing unit 120 connected in parallel to the voltage dividing unit 1220 removes noise applied to the output node N8 through the capacitors CP and CN.

Hereinafter, the operation of the above-described internal power voltage driving unit 1000 is explained.

The comparison unit 1120 compares the reference voltage control signal VREF_CTR with the internal voltage reference signal VINT_REF. When the level of the reference voltage control signal VREF_CTR is higher than that of the internal voltage reference signal VINT_REF, the NMOS transistor NM13 is turned on to apply a low level signal to the node N7. When the level of the reference voltage control signal VREF_CTR is lower than that of the internal voltage reference signal VINT_REF, the NMOS transistor NM14 is turned on to apply a high level signal to the node N7.

The PMOS transistors PM10~PM12 of the driving unit 1210 apply a power voltage level to the output node N8 in response to a signal of the node N7. The noise preventing unit 1230 divides the internal power voltage Vin of the output node N8 to output the internal voltage reference signal VINT_REF.

Thereafter, the comparison unit 1120 re-compares the reference voltage control signal VREF_CTR with the internal voltage reference signal VINT_REF outputted from the noise preventing unit 1230.

The above-described process is repeated until the level of the reference voltage control signal VREF_CTR becomes identical with that of the internal voltage reference signal VINT_REF. When the level of the reference voltage control signal VREF_CTR is lower than that of the internal voltage reference signal VINT_REF, a high level signal is applied to the node N7 to turn off the driving unit 1200.

Through the above-described process, the level of the internal voltage reference signal VINT_REF becomes identical with that of the reference voltage control signal VREF, so that the internal power voltage Vin becomes twice larger than the internal voltage reference signal VINT_REF. Preferably, the PMOS transistors PM13 and PM14 have the same size.

In this way, the reference voltage control unit 900 regulates the reference voltage control signal VREF_CTR in response to the internal power control signals IVL_CTR3~IVL_CTR5, and the internal power voltage driving unit 1000 changes the level of the internal power voltage Vin in response to the reference voltage control signal VREF_CTR.

As described above, in a semiconductor memory device according to an embodiment of the present invention, an internal power control signal is outputted when an extended mode register is set, and a potential of an internal power voltage such as a core voltage, a boosting voltage and an internal voltage which are used in an internal circuit is regulated, so that a tWR (time to write recovery) the speed of the semiconductor memory device after packaged can be adjusted.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A semiconductor memory device comprising:
   an extended mode register setting unit, when an internal circuit enters into a specific mode for high-speed operation, for outputting a plurality of internal power control signals to regulate a potential of an internal power voltage of the internal circuit; and
   An internal power voltage generating unit for generating an internal power voltage by regulating the potential of the internal power voltage in response to the plurality of internal power control signals.

2. The semiconductor memory device according to claim 1, wherein the internal power voltage generating unit comprises:
   a boosting unit for boosting an external power voltage to output the internal power voltage; and
   an internal power voltage control unit for outputting a voltage control signal to control the boosting unit in response to the plurality of internal power control signals.

3. The semiconductor memory device according to claim 2, wherein the internal power voltage control unit comprises:
   a voltage dividing unit for dividing the internal power voltage to output a voltage dividing signal; and
   a sensing control unit for comparing a reference voltage signal with the voltage dividing signal to output the voltage control signal depending on the comparison result.

4. The semiconductor memory device according to claim 3, wherein the voltage dividing unit comprises:
   a plurality of resistors connected serially between an internal power voltage terminal and a ground voltage terminal;
   a first switching device, connected in parallel to one of the plurality of resistors, for controlling a level of the voltage control signal in response to a first internal power control signal of the plurality of internal power control signals; and
   a second switching device, connected in parallel to the other of the plurality of resistors, for controlling a level of the voltage control signal in response to a second internal power control signal of the plurality of internal power control signals.

5. The semiconductor memory device according to claim 4, wherein the first and the second switching devices are NMOS transistors.

6. The semiconductor memory device according to claim 3, wherein the sensing control unit comprises:
   an enable unit for enabling the sensing control unit in response to a predetermined active signal;
   a comparison unit, located between the enable unit and the current mirror, for comparing a level of the reference voltage signal with that of the voltage dividing signal
   a current mirror for outputting a predetermined current in response to an output signal from the comparison unit; and
   an inverting unit for inverting an output signal from a common node of the current mirror and the comparison unit.

7. The semiconductor memory device according to claim 6, wherein the current mirror comprises first and second switching devices which have drains to receive a peri voltage and gates connected in common.

8. The semiconductor memory device according to claim 7, wherein the first and the second switching devices are PMOS transistors.

9. The semiconductor memory device according to claim 8, wherein the comparison unit comprises:
   a third switching device which has a drain connected to a drain of the first switching device and is controlled by the voltage dividing signal; and
   a fourth switching device which has a drain connected to a drain of the second switching device and is controlled by the reference voltage signal.

10. The semiconductor memory device according to claim 9, wherein the third and the fourth switching devices are NMOS transistors.

11. A semiconductor memory device comprising:
- an extended mode register setting unit, when an internal circuit enters into a specific mode for high-speed operation, for outputting a plurality of internal power control signals to regulate a potential of an internal power voltage of the internal circuit;
- a reference voltage control unit for controlling a reference voltage level in response to the plurality of internal power control signals to generate a reference voltage control signal; and
- an internal power voltage driving unit for regulating an internal power voltage level in response to the reference voltage control signal.

12. The semiconductor memory device according to claim 1, wherein the reference voltage control unit comprises:
- a voltage control unit, enabled by a predetermined control signal, for dividing a power voltage in response to the plurality of internal power control signals; and
- a differential amplification unit for comparing a reference voltage signal with an output signal from the voltage control unit to apply the predetermined control signal to the voltage control unit.

13. The semiconductor memory device according to claim 12, wherein the voltage control unit comprises:
- a voltage dividing unit, enabled by an output signal from the differential amplification unit, for dividing a power voltage into a plurality of resistance ratios to output a plurality of dividing voltages; and
- a switching unit for selectively applying the plurality of dividing voltages to the differential amplification unit in response to the plurality of internal power control signals.

14. The semiconductor memory device according to claim 13, wherein the voltage dividing unit comprises:
- a switching element for applying the power voltage level to an output terminal in response to the output signal from the differential amplification unit; and
- a plurality of resistors for dividing an output voltage of the switching element.

15. The semiconductor memory device according to claim 13, wherein the switching unit comprises a plurality of NMOS transistors, arranged in parallel, for applying the plurality of dividing voltages in response to the plurality of internal power control signals, respectively.

16. The semiconductor memory device according to claim 11, wherein the internal voltage generating unit comprises:
- an output unit for outputting the internal voltage using a power voltage in response to a predetermined control signal and dividing the internal voltage to output an internal voltage reference signal; and
- a differential amplification unit for comparing the internal voltage reference signal with the internal voltage control signal to apply the predetermined control signal to the output unit.

17. The semiconductor memory device according to claim 16, wherein the output unit comprises:
- a driving unit for applying the power voltage level to an output terminal in response to the predetermined control signal to output the internal voltage; and
- a voltage dividing unit for dividing the internal voltage.

18. The semiconductor memory device according to claim 17, further comprising a noise preventing unit for preventing noise applied to an output terminal of the internal voltage.

19. The semiconductor memory device according to claim 17, wherein the driving unit comprises a plurality of switching elements which are connected in parallel to a power voltage terminal and the output terminal of the internal voltage and controlled by the predetermined control signal.

20. The semiconductor memory device according to claim 17, wherein the voltage dividing unit comprises a plurality of diodes which are connected serially between the output terminal of the internal voltage and a ground voltage terminal.

* * * * *